(12) United States Patent
Lee et al.

(10) Patent No.: US 9,748,295 B2
(45) Date of Patent: Aug. 29, 2017

(54) IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Kwang Hee Lee, Yongin-si (KR); Gae Hwang Lee, Seongnam-si (KR); Sung Young Yun, Suwon-si (KR); Dong-Seok Leem, Hwaseong-si (KR); Xavier Bulliard, Seongnam-si (KR); Yong Wan Jin, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/155,658

(22) Filed: May 16, 2016

(65) Prior Publication Data

US 2017/0141149 A1 May 18, 2017

(30) Foreign Application Priority Data

Nov. 18, 2015 (KR) .......................... 10-2015-0161884

(51) Int. Cl.
*H01L 27/146* (2006.01)
(52) U.S. Cl.
CPC .. *H01L 27/14621* (2013.01); *H01L 27/14645* (2013.01); *H01L 27/14647* (2013.01); *H01L 27/14685* (2013.01)
(58) Field of Classification Search
CPC ......... H01L 27/14621; H01L 27/14645; H01L 31/1013
See application file for complete search history.

(56) References Cited

U.S. PATENT DOCUMENTS

| 3,971,065 | A | 7/1976 | Bayer |
| 5,323,233 | A | 6/1994 | Yamagami et al. |
| 6,476,865 | B1 | 11/2002 | Gindele et al. |
| 7,667,750 | B2 | 2/2010 | Goto et al. |
| 8,035,708 | B2 | 10/2011 | Takizawa et al. |
| 8,481,908 | B2 | 7/2013 | Inaba |

(Continued)

FOREIGN PATENT DOCUMENTS

EP 2985800 A1 2/2016

OTHER PUBLICATIONS

Extended European Search Report dated Mar. 4, 2017 for application No. 16188404.4.

*Primary Examiner* — Earl Taylor
(74) *Attorney, Agent, or Firm* — Harness, Dickey & Pierce, PLC

(57) ABSTRACT

An electronic device may include at least one image sensor that includes a plurality of photo-sensing devices, a photoelectric device on one side of the semiconductor substrate and configured to selectively sense first visible light, and a plurality of color filters on separate photo-sensing devices. The plurality of color filters may include a first color filter configured to selectively transmit a second visible light that is different from the first visible light and a second color filter transmitting first mixed light including the second visible light. The electronic device may include multiple arrays of color filters. The electronic device may include different photoelectric devices on the separate arrays of color filters. The different photoelectric devices may be configured to sense different wavelength spectra of light.

24 Claims, 25 Drawing Sheets

(56) References Cited

U.S. PATENT DOCUMENTS

| | | |
|---|---|---|
| 8,670,054 B2 | 3/2014 | Takizawa |
| 8,860,016 B2 | 10/2014 | Suzuki |
| 9,000,566 B2 | 4/2015 | Golda et al. |
| 9,130,175 B2* | 9/2015 | Lee .................... H01L 51/0072 |
| 9,252,371 B1* | 2/2016 | Yagi ..................... H01L 51/008 |
| 2007/0291144 A1* | 12/2007 | Suzuki ............... H01L 27/14621 348/272 |
| 2008/0246853 A1 | 10/2008 | Takizawa et al. |
| 2014/0001454 A1 | 1/2014 | Miyanami et al. |
| 2014/0138665 A1 | 5/2014 | Takizawa |
| 2014/0346466 A1* | 11/2014 | Lee .................... H01L 51/0072 257/40 |
| 2014/0375826 A1* | 12/2014 | Lee ..................... H01L 27/307 348/207.1 |
| 2015/0042855 A1* | 2/2015 | Baek ................... H04N 5/3535 348/294 |
| 2015/0162548 A1* | 6/2015 | Lim .................... H01L 51/0072 257/40 |
| 2015/0188064 A1* | 7/2015 | Kim ................. H01L 27/14645 257/40 |
| 2015/0200226 A1* | 7/2015 | Jin .................. H01L 27/14645 257/432 |
| 2015/0287766 A1* | 10/2015 | Kim ..................... H01L 27/307 250/208.1 |
| 2015/0372036 A1* | 12/2015 | Suh .................... H01L 27/1462 348/273 |
| 2016/0020258 A1* | 1/2016 | Park ..................... H01L 27/307 257/40 |
| 2016/0020401 A1* | 1/2016 | Bulliard ............ H01L 51/0058 257/40 |
| 2016/0035793 A1* | 2/2016 | Park ..................... H01L 27/307 257/40 |
| 2016/0049448 A1* | 2/2016 | Lee ..................... H01L 51/442 257/40 |
| 2016/0064455 A1* | 3/2016 | Leem ................... H01L 27/307 257/40 |
| 2016/0064456 A1* | 3/2016 | Lee ..................... H01L 27/307 257/40 |
| 2016/0064457 A1* | 3/2016 | Lee ..................... H01L 27/307 257/40 |
| 2016/0065913 A1* | 3/2016 | Park ..................... H04N 9/045 348/280 |
| 2016/0071893 A1* | 3/2016 | Shinohara ......... H01L 27/14605 257/432 |
| 2016/0087012 A1* | 3/2016 | Lee ..................... H01L 27/307 257/40 |
| 2016/0093675 A1* | 3/2016 | Lee ..................... H01L 27/307 257/40 |
| 2016/0099430 A1* | 4/2016 | Kim ..................... H01L 51/447 257/40 |
| 2016/0111651 A1* | 4/2016 | Yun .................... H01L 51/4253 257/40 |
| 2016/0126470 A1* | 5/2016 | Ro ..................... H01L 51/0053 257/40 |
| 2016/0149132 A1* | 5/2016 | Lim .................... C07F 7/0818 257/40 |
| 2016/0155954 A1* | 6/2016 | Lim .................... H01L 51/0061 257/40 |
| 2016/0155975 A1* | 6/2016 | Jin ...................... H01L 51/447 257/40 |
| 2016/0181547 A1* | 6/2016 | Han .................... H01L 51/0072 257/40 |
| 2016/0197122 A1* | 7/2016 | Ryuichi ............. H01L 27/307 257/40 |
| 2016/0211465 A1* | 7/2016 | Tadao ................. H01L 51/0071 |
| 2016/0225826 A1* | 8/2016 | Ishibe ................ H01L 51/0059 |

* cited by examiner

FIG. 24

| B | G | R |
|---|---|---|
| R | B | G |
| G | R | B |

IMAGE SENSOR AND ELECTRONIC DEVICE INCLUDING THE SAME

RELATED APPLICATIONS

This application claims priority to and the benefit of Korean Patent Application No. 10-2015-0161884 filed in the Korean Intellectual Property Office on Nov. 18, 2015, the entire contents of which are incorporated herein by reference.

BACKGROUND

1. Field

Example embodiments relate to image sensors and electronic devices including the same.

2. Description of the Related Art

An imaging device is used in a digital camera and a camcorder, etc., to capture an image and to store it as an electrical signal. The imaging device may include an image sensor that separates incident light into separate components according to a wavelength and converts each component to a separate electrical signal.

There has been an ongoing demand for reduction in the size of the image sensor. Recently, in order to reduce the image sensor size, an image sensor having a stacking structure has been researched.

SUMMARY

Some example embodiments provide an image sensor having a novel structure which may be configured to sense light with improved light absorption efficiency and sensitivity.

Some example embodiments provide an electronic device including the image sensor.

According to some example embodiments, an image sensor may include a semiconductor substrate including a plurality of photo-sensing devices, a photoelectric device on the semiconductor substrate and configured to selectively sense a first visible light, the first visible light including light in a first wavelength spectrum, and a plurality of color filters on the plurality of photo-sensing devices, each of the color filters being on a separate photo-sensing device of the plurality of photo-sensing devices, the plurality of color filters including a first color filter configured to selectively transmit second visible light, the second visible light including light in a second wavelength spectrum, the second wavelength spectrum being different from the first wavelength spectrum, and a second color filter configured to transmit a first mixed light, the first mixed light including light in the second wavelength spectrum and light in a third wavelength spectrum, the third wavelength spectrum being different from the second wavelength spectrum.

In some example embodiments, the plurality of color filters may include a color filter array, the color filter array including a quantity of first color filters and a quantity of second color filters, the quantity of first color filters may include at least one first color filter, the quantity of second color filters may include at least one second color filter, and the quantity of second color filters may be equal to or greater than the quantity of first color filters.

In some example embodiments, the plurality of photo-sensing devices may include a first photo-sensing device overlapping with the first color filter and configured to sense the second visible light, and a second photo-sensing device overlapping with the second color filter and configured to sense a second mixed light, the second mixed light including the second visible light.

In some example embodiments, the second mixed light and the first mixed light may have a common wavelength spectrum, and each of the first mixed light and the second mixed light excludes the first visible light.

In some example embodiments, each of the first mixed light and the second mixed light may include at least one of a mixture of blue light and green light, and a mixture of red light and green light.

In some example embodiments, the first mixed light may include the first visible light, and the second mixed light excludes the first visible light.

In some example embodiments, each of the first mixed light and the second mixed light may include green light.

In some example embodiments, the first mixed light may include a mixture of red light, green light, and blue light, and the second mixed light may include at least one of a mixture of blue light and green light, and a mixture of red light and green light.

In some example embodiments, the second visible light includes blue light, and the second mixed light includes a mixture of blue light and green light.

In some example embodiments, the second visible light may include red light, and the second mixed light includes a mixture of red light and green light.

In some example embodiments, the first photo-sensing device may have a first thickness, the second photo-sensing device has a second thickness, and the first thickness is different from the second thickness.

In some example embodiments, the second thickness may be greater than the first thickness.

In some example embodiments, the first visible light may include at least one of red light and blue light.

In some example embodiments, the first visible light includes red light and the second visible light includes blue light.

In some example embodiments, the first visible light may include blue light and the second visible light includes red light.

In some example embodiments, the first mixed light includes a mixed light, the mixed light including at least the first visible light.

In some example embodiments, the first mixed light may include a mixed light, the mixed light including red light, green light, and blue light.

In some example embodiments, the first mixed light may include a mixed light, the mixed light excluding the first visible light.

In some example embodiments, the photoelectric device may include a pair of electrodes, the electrodes facing each other, and a light absorption layer between the pair of electrodes, the light absorption layer being configured to selectively absorb the first visible light.

According to some example embodiments, an electronic device may include an image sensor. The image sensor may include a semiconductor substrate including a plurality of photo-sensing devices, a photoelectric device on the semiconductor substrate and configured to selectively sense a first visible light, the first visible light including light in a first wavelength spectrum, and a plurality of color filters on the plurality of photo-sensing devices, each of the color filters being on a separate photo-sensing device of the plurality of photo-sensing devices, the plurality of color filters including a first color filter configured to selectively transmit second visible light, the second visible light including light in a second wavelength spectrum, the second wavelength spectrum being different from the first wavelength spectrum, and a second color filter configured to transmit a first mixed light, the first mixed light including light in the second wavelength spectrum and light in a third wavelength spectrum, the third wavelength spectrum being different from the second wavelength spectrum.

According to some example embodiments, an image sensor may include at least first and second arrays of photo-sensing devices, at least first and second arrays of color filters on separate, respective ones of the first and second arrays of photo-sensing devices, each array of color filters including at least two color filters configured to selectively transmit at least two separate wavelength spectra of light, and at least one photoelectric device on the first and second arrays of color filters, the at least one photoelectric device being configured to selectively sense a wavelength spectrum of light that is different from the at least two separate light wavelength spectra of light.

In some example embodiments, the at least one photoelectric device may include first and second photoelectric devices on separate, respective ones of the first and second arrays of color filters, the first and second photoelectric devices being configured to selectively sense different wavelength spectra of light.

In some example embodiments, the first color filter array may include a quantity of first color filters and a quantity of second color filters, the second plurality of filters may include a second color filter array, and the second color filter array may include at least a quantity of third color filters.

In some example embodiments, the second color filter array may include a quantity of second color filters.

In some example embodiments, the second color filter array may include a quantity of fourth color filters.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIG. 23 and FIG. 24 are schematic views showing disposition of a color filter layer in a non-stacked image sensor according to some example embodiments.

DETAILED DESCRIPTION

Figure 1:
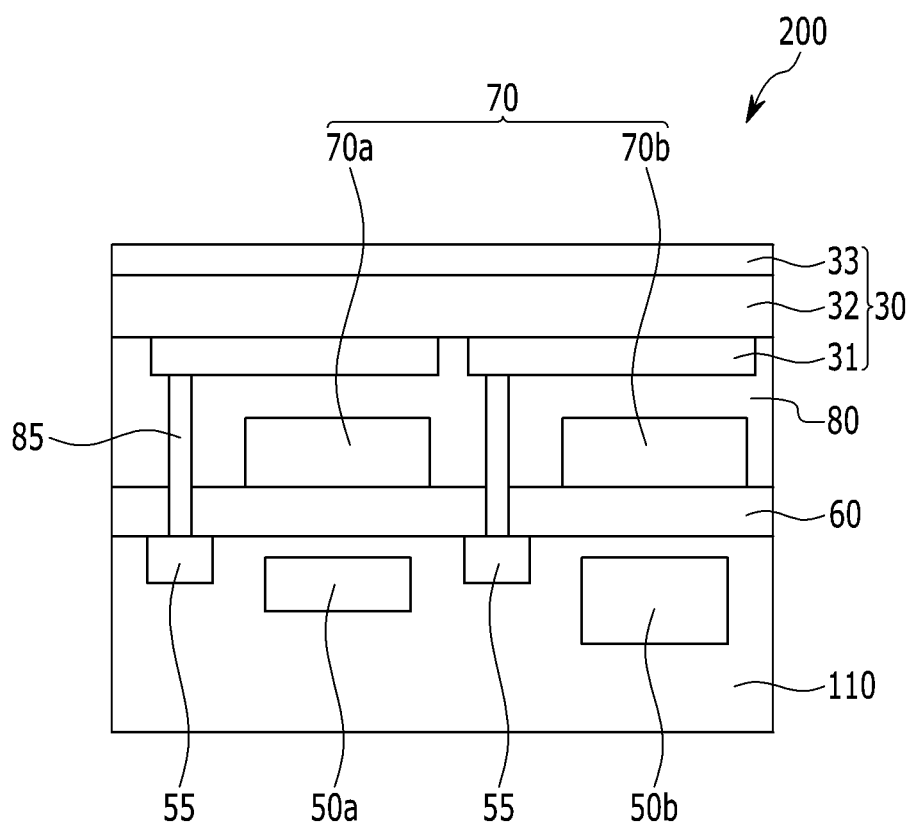
FIG. 1 is a schematic cross-sectional view of an image sensor according to some example embodiments.

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), an application-specific integrated circuit (ASIC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, an image sensor according to some example embodiments is described referring to drawings. Herein, a CMOS image sensor as an example of an image sensor is described.

FIG. 1 is a schematic cross-sectional view showing an image sensor according to some example embodiments.

Referring to FIG. 1, an image sensor 200 according to some example embodiments includes a photoelectric device 30; a semiconductor substrate 110 including a plurality of photo-sensing devices 50a and 50b, a charge storage 55 and a transmission transistor (not shown); and a color filter layer 70.

The photoelectric device 30 is positioned at a light-incident side and may selectively sense light in a first wavelength spectrum of light (hereinafter, referred to 'first visible light'). The first visible light may be one of light of three primary colors.

The photoelectric device 30 includes a lower electrode 31 and an upper electrode 33 facing each other and a light absorption layer 32 between the lower electrode 31 and the upper electrode 33.

One of the lower electrode 31 and the upper electrode 33 is an anode and the other is a cathode. At least one of the lower electrode 31 and the upper electrode 33 may be a light-transmitting electrode, and the light-transmitting electrode may be made of, for example, a transparent conductor including indium tin oxide (ITO) or indium zinc oxide (IZO), or may be a metal thin layer having a thin thickness of several nanometers or several tens of nanometers or a metal thin layer having a thin thickness of several nanometers to several tens of nanometers doped with a metal oxide.

The light absorption layer 32 may selectively absorb the first visible light. The light absorption layer 32 may selectively absorb the first visible light but pass the rest of light except for the first visible light.

For example, the first visible light may be red light having a wavelength spectrum with a maximum absorption wavelength ($\lambda_{max}$) in a range of greater than about 600 nm and less than or equal to about 700 nm. Specifically, the first visible light may be red light having a wavelength spectrum with a maximum absorption wavelength ($\lambda_{max}$) in a range of about 630 nm to about 680 nm.

In another example, the first visible light may be blue light having a wavelength spectrum with a maximum absorption wavelength ($\lambda_{max}$) in a range of greater than or equal to about 400 nm to less than about 500 nm. Specifically, the first visible light may be blue light having a wavelength spectrum with a maximum absorption wavelength ($\lambda_{max}$) in a range of about 420 nm to about 480 nm within the range.

In another example, the first visible light may be green light having a wavelength spectrum with a maximum absorption wavelength ($\lambda_{max}$) in a range of about 500 nm to about 600 nm. Specifically, the first visible light may be green light having a wavelength spectrum with a maximum absorption wavelength ($\lambda_{max}$) in a range of about 520 nm to 580 nm within the range.

The light absorption layer 32 may include a p-type semiconductor and an n-type semiconductor, and the p-type semiconductor and the n-type semiconductor may form a pn junction. The light absorption layer 32 may selectively absorb the first visible light to generate excitons, then the generated excitons may be separated into holes and electrons, and then separated holes transfer to an anode that is one of the lower electrode 31 and the upper electrode 33 and separated electrons transfer to a cathode that is one of the lower electrode 31 and the upper electrode 33 to provide a photoelectric effect. The separated electrons and/or holes may be collected in the charge storage 55.

At least one of the p-type semiconductor and the n-type semiconductor may selectively absorb first visible light. The p-type semiconductor and the n-type semiconductor may independently include an organic material, an inorganic material, or an organic/inorganic material. At least one of the p-type semiconductor and the n-type semiconductor may include an organic material.

The light absorption layer 32 may be a single layer or a multilayer. The light absorption layer 32 may be, for example an intrinsic layer (I layer), a p-type layer/I layer, an I layer/n-type layer, a p-type layer/I layer/n-type layer, a p-type layer/n-type layer, and the like.

The intrinsic layer (I layer) may include the p-type semiconductor and the n-type semiconductor in a volume ratio of about 1:100 to about 100:1. The p-type semiconductor and the n-type semiconductor may be mixed in a volume ratio of about 1:50 to about 50:1, about 1:10 to about 10:1, or about 1:1. When the p-type and n-type semiconductors have a composition ratio within the range, an exciton may be effectively produced and a pn junction may be effectively formed.

The p-type layer may include the p-type semiconductor, and the n-type layer may include the n-type semiconductor.

The light absorption layer 32 may have a thickness of about 1 nm to about 500 nm, for example, about 5 nm to about 300 nm or about 5 nm to about 200 nm. Within the thickness range, the light absorption layer 32 may effectively absorb first visible light, effectively separate holes from electrons, and deliver them, thereby effectively improving photoelectric conversion efficiency.

The light absorption layer 32 may be formed on the whole surface of the image sensor image sensor 200. Thereby, as the first visible light may be selectively absorbed on the whole surface of the image sensor, the light absorption area may be increased to provide high light-absorptive efficiency.

The semiconductor substrate 110 may be a silicon substrate, and may be integrated with at least one of a first photo-sensing device 50a, a second photo-sensing device 50b, a charge storage 55, and a transmission transistor (not shown).

The first photo-sensing device 50a and the second photo-sensing device 50b may be a photodiode. The first photo-sensing device 50a and the second photo-sensing device 50b sense each light, and sensed information may be transferred by the transmission transistor. The charge storage 55 is electrically connected with the photoelectric device 30 and information of the charge storage 55 may be transferred by the transmission transistor.

A metal wire (not shown) and a pad (not shown) are formed on the first photo-sensing device 50a and the second photo-sensing device 50b. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be positioned under the first photo-sensing device 50a and the second photo-sensing device 50b.

A lower insulation layer 60 and an upper insulation layer 80 are formed on the semiconductor substrate 110. The lower insulation layer 60 and the upper insulation layer 80 may be made of an inorganic insulating material such as a silicon oxide and/or a silicon nitride, or a low dielectric constant (low K) material such as SiC, SiCOH, SiCO, and SiOF. The lower insulation layer 60 and the upper insulation layer 80 have a trench 85 exposing the charge storage 55. The trench 85 may be filled with fillers. At least one of the lower insulation layer 60 and the upper insulation layer 80 may be omitted.

The color filter layer 70 may include a plurality of unit color filter arrays repetitively arranged along with a matrix, and the unit color filter arrays may for example have various matrix arrangements of 2×2, 3×3, 4×4, and the like.

The unit color filter array includes at least one first color filter 70a configured to selectively transmit one single wavelength spectrum of light out of three primary colors and at least one second color filter 70b configured to selectively transmit a wavelength spectrum of mixed light of at least two colors out of three primary colors.

The first color filter 70a may selectively pass light in a second wavelength spectrum (hereinafter, referred to 'second visible light') that is different from the first visible light, and may for example be a red filter configured to selectively transmit red light, a blue filter configured to selectively transmit blue light, or a green filter configured to selectively transmit green light.

For example, when the first visible light is red light, the first color filter 70a may be a blue filter configured to selectively transmit blue light having a wavelength spectrum with a maximum absorption wavelength ($\lambda_{max}$) in a range of greater than or equal to about 400 nm to less than or equal to about 500 nm or a green filter configured to selectively transmit green light having a wavelength spectrum with a maximum absorption wavelength ($\lambda_{max}$) in a range of about 500 nm to about 600 nm.

In another example, when the first visible light is blue light, the first color filter 70a may be a red filter configured to selectively transmit red light having a wavelength spectrum with a maximum absorption wavelength ($\lambda_{max}$) in a range of greater than about 600 nm to less than or equal to about 700 nm or a green filter configured to selectively transmit green light having a wavelength spectrum with a maximum absorption wavelength ($\lambda_{max}$) in a range of about 500 nm to about 600 nm.

In another example, when the first visible light is green light, the first color filter 70a may be a blue filter configured to selectively transmit blue light having a wavelength spectrum with a maximum absorption wavelength ($\lambda_{max}$) in a range of greater than or equal to about 400 nm to less than or equal to about 500 nm or a red filter configured to selectively transmit red light having a wavelength spectrum with a maximum absorption wavelength ($\lambda_{max}$) in a range of greater than about 600 nm to less than or equal to about 700 nm.

The second color filter 70b may for example pass mixed light of at least two selected from blue light, green light, and red light, for example, mixed light of blue light and green light and thus may be, for example, a cyan filter configured to selectively transmit mixed light of blue light and green light, a yellow filter configured to selectively transmit mixed light of red light and green light, a magenta filter configured to selectively transmit mixed light of blue light and red light, or a white filter configured to selectively transmit mixed light of blue light, green light, and red light.

For example, the second color filter 70b may pass mixed light including the second visible light.

In another example, the second color filter 70b may pass mixed light including the second visible light but excluding the first visible light.

In another example, the second color filter 70b may pass mixed light of light in a third visible ray region (hereinafter, referred to 'third visible light'), differing from the first visible light and the second visible light, and the second visible light.

In another example, the second color filter 70b may pass mixed light of the first visible light, the second visible light, and the third visible light.

In another example, when the first visible light is red light, the second visible light is blue light, and the third visible light is green light, the second color filter 70b may be a cyan filter configured to selectively transmit mixed light of the blue light and the green light.

In another example, when the first visible light is red light, the second visible light is blue light, and the third visible light is green light, the second color filter 70b may be a white filter configured to selectively transmit mixed light of the blue light, the green light, and the red light.

In another example, when the first visible light is red light, the second visible light is green light, and the third visible light is blue light, the second color filter 70b may be a cyan filter configured to selectively transmit mixed light of the blue light and the green light.

In another example, when the first visible light is red light, the second visible light is green light, and the third visible light is blue light, the second color filter 70b may be a white filter configured to selectively transmit mixed light of the blue light, the green light, and the red light.

In another example, when the first visible light is blue light, the second visible light is red light, and the third visible light is green light, the second color filter 70b may be a yellow filter configured to selectively transmit mixed light of the red light and the green light.

In another example, when first visible light is blue light, the second visible light is red light, and the third visible light is green light, the second color filter 70b may be a white filter configured to selectively transmit mixed light of the red light, the green light, and the blue light.

In another example, when the first visible light is blue light, the second visible light is green light, and the third visible light is red light, the second color filter 70b may be a yellow filter configured to selectively transmit mixed light of the red light and the green light.

In another example, when the first visible light is blue light, the second visible light is green light, and the third visible light is red light, the second color filter 70b may be a white filter configured to selectively transmit mixed light of the blue light, the green light, and the red light.

In another example, when the first visible light is green light, the second visible light is red light, and the third visible light is blue light, the second color filter 70b may be a magenta filter configured to selectively transmit mixed light of the red light and the blue light.

In another example, when the first visible light is green light, the second visible light is red light, and the third visible light is blue light, the second color filter 70b may be a white filter configured to selectively transmit mixed light of the blue light, the green light, and the red light.

The unit color filter array may include at least one first color filter 70a and at least one second color filter 70b, and herein, the quantity of second color filters 70b may be the same as or greater than the quantity of first color filters 70a. In this way, when the quantity of second color filters 70b configured to selectively transmit mixed light is the same as or greater than the quantity of first color filters 70a configured to selectively transmit one single light, high sensitivity and high luminance characteristics may be realized by limiting and/or preventing sharp deterioration of sensitivity and luminance of an image sensor under a low level light environment.

Figure 2:
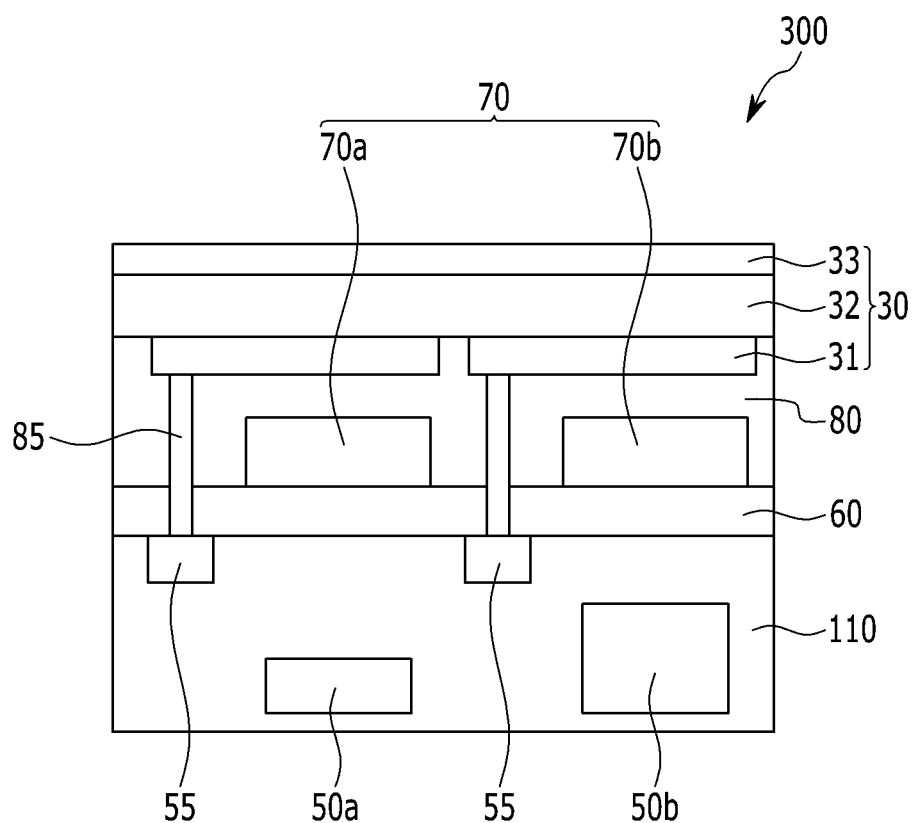
FIG. 2 is a schematic cross-sectional view of an image sensor according to some example embodiments.

FIG. 2 is a cross-sectional view showing an image sensor according to some example embodiments.

Referring to FIG. 2, the image sensor 300 according to some example embodiments includes the semiconductor substrate 100 including the photoelectric device 30; the first and second photo-sensing devices 50a and 50b, the charge storage 55, and the transmission transistor (not shown); the color filter layer 70; the lower insulation layer 60; and the upper insulation layer 80 like the image sensor of the above embodiment.

In some example embodiments, the first and second photo-sensing devices 50a and 50b are formed deep from the surface of the semiconductor substrate 110. Since the first photo-sensing device 50a and the second photo-sensing device 50b may sense light in different wavelength regions out of a visible ray region depending on a stacking depth, the first photo-sensing device 50a and the second photo-sensing device 50b may be variously positioned depending on the wavelength regions.

FIG. 3, FIG. 4, FIG. 5, and FIG. 6 are schematic views respectively showing various examples of a unit color filter array in an image sensor according to some example embodiments.

Figure 3:
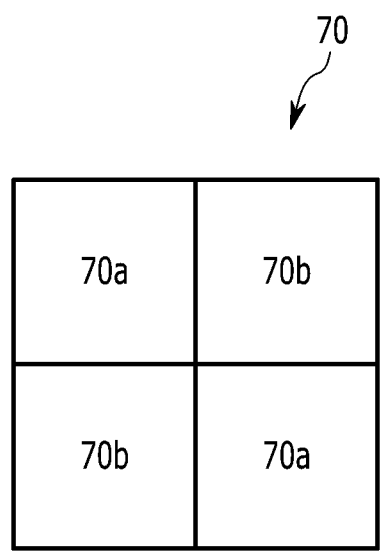
FIG. 3, FIG. 4, FIG. 5, and FIG. 6 are schematic views respectively showing various unit color filter arrays in an image sensor according to some example embodiments.

Referring to FIG. 3, the unit color filter array according to some example embodiments may have a 2×2 matrix format and consist of two first color filters 70a and two second color filters 70b.

Figure 4:
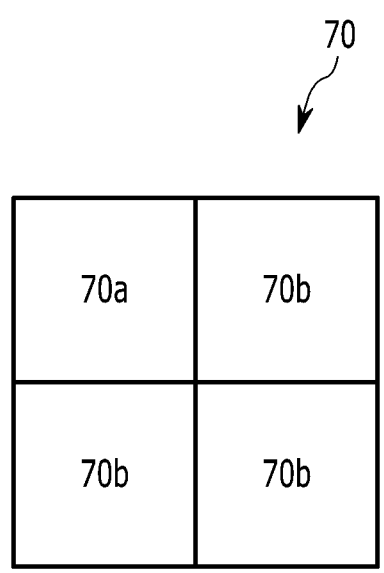

Referring to FIG. 4, the unit color filter array according to some example embodiments may have a 2×2 matrix format and consist of one first color filter 70a and three second color filters 70b.

Figure 5:
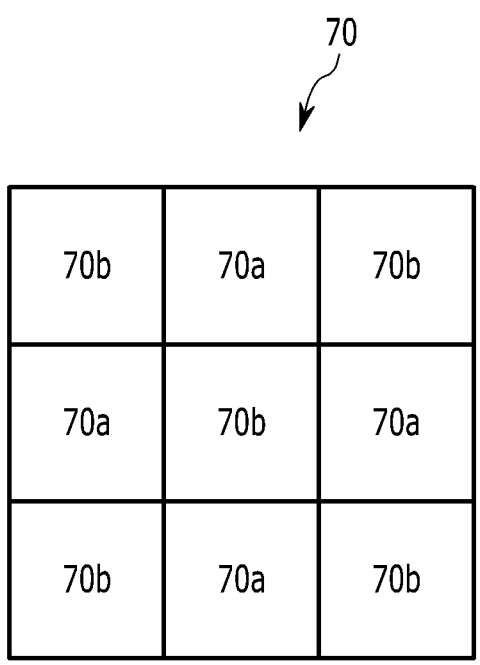

Referring to FIG. 5, the unit color filter array according to some example embodiments may have a 3×3 matrix format and consist of four first color filters 70a and five second color filters 70b.

Figure 6:
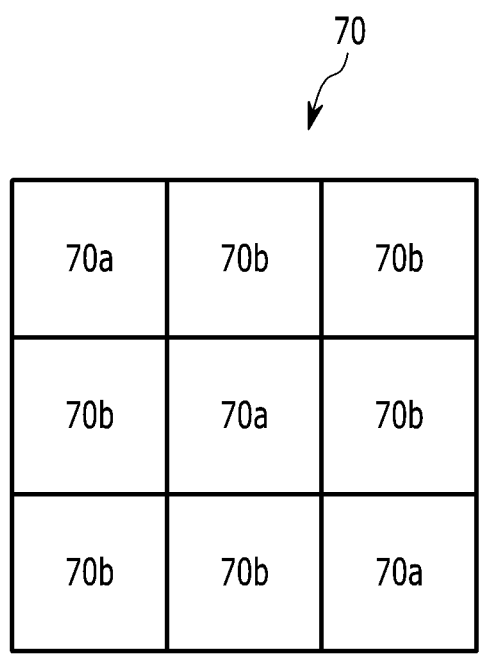

Referring to FIG. 6, the unit color filter array according to some example embodiments may have a 3×3 matrix format and consist of three first color filters 70a and six second color filters 70b.

The first photo-sensing device 50a overlaps with the first color filter 70a, and the second photo-sensing device 50b overlaps with the second color filter 70b.

The first photo-sensing device 50a may sense light passing the photoelectric device 30 and the first color filter 70a. In other words, the first visible light out of the incident light may be absorbed in the photoelectric device 30, and the second visible light passing the first color filter 70a out of light passing the photoelectric device 30 except for the first visible light may be sensed by the first photo-sensing device 50a.

The second photo-sensing device 50b may sense light passing the photoelectric device 30 and the second color filter 70b. In other words, the first visible light out of the incident light may be selectively absorbed in the photoelectric device 30, and mixed light passing the photoelectric device 30 except for the first visible light may be sensed by the second photo-sensing device 50b.

The mixed light sensed by the second photo-sensing device 50b may be the same as or different from the mixed light passing the second color filter 70b.

For example, when the second color filter 70b passes the mixed light including the first visible light, the mixed light sensed by the second photo-sensing device 50b may be different from the mixed light passing the second color filter 70b.

In another example, when the first visible light absorbed in the photoelectric device 30 is red light, and the second color filter 70b is a white filter configured to selectively transmit red light, green light, and blue light, the second photo-sensing device 50b may sense mixed light of the blue light and the green light, that is, cyan light.

In another example, when the first visible light absorbed in the photoelectric device 30 is blue light, and the second color filter 70b is a white filter configured to selectively transmit red light, green light, and blue light, the second photo-sensing device 50b may sense mixed light of the red light and the green light, that is, yellow light.

In another example, when the mixed light passing the second color filter 70b includes no first visible light, the mixed light sensed by the second photo-sensing device 50b may be the same as the mixed light passing the second color filter 70b.

In another example, when the first visible light absorbed in the photoelectric device 30 is red light, and the second color filter 70b is a cyan filter configured to selectively transmit mixed light of blue light and green light, the second photo-sensing device 50b may sense mixed light of the blue light and the green light, that is, cyan light.

In another example, when the first visible light absorbed in the photoelectric device 30 is blue light, and the second color filter 70b is a yellow filter configured to selectively transmit mixed light of red light and green light, the second photo-sensing device 50b may sense the mixed light of red light and green light, that is, yellow light.

FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, and FIG. 22 are respectively schematic views showing disposition examples of a photoelectric device and a color filter layer in an image sensor according to some example embodiments. FIG. 7, FIG. 8, FIG. 9, FIG. 10, FIG. 11, FIG. 12, FIG. 13, and FIG. 14 show a unit pixel group having a 2×2 matrix format, and FIG. 15, FIG. 16, FIG. 17, FIG. 18, FIG. 19, FIG. 20, FIG. 21, and FIG. 22 show a unit pixel group having a 3×3 matrix format, but the embodiments are not limited thereto.

Figure 7:
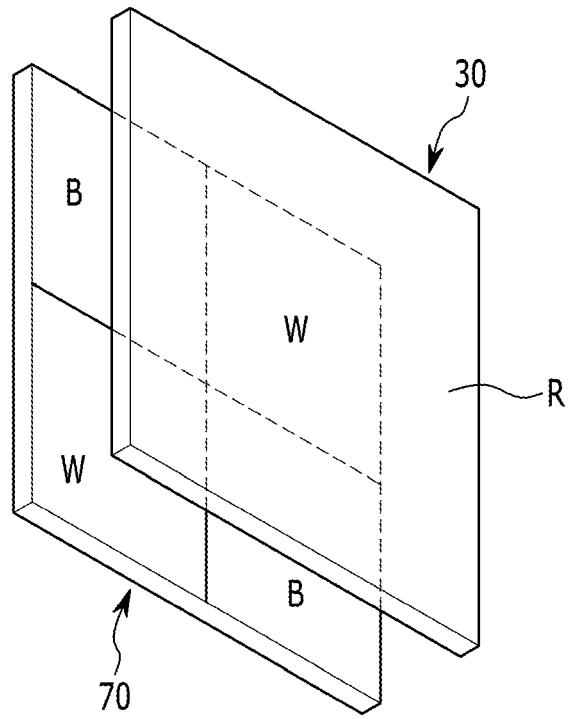
FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, and FIG. 22 are schematic views respectively showing examples of disposing a photoelectric device and a color filter layer in an image sensor according to some example embodiments.

Referring to FIG. 7, an image sensor according to some example embodiments may include a red photoelectric device (R) formed on the whole surface and thus selectively absorbing and sensing red light and the color filter layer 70 including at least one blue filter (B) configured to selectively transmit blue light, and at least one white filter (W) configured to selectively transmit mixed light of blue light, red light, and green light in a 2×2 matrix format. The quantity of blue filters (B) may be the same as the quantity of white filters (W). Herein, the first photo-sensing device 50a overlapping with the blue filter (B) may sense blue light passing the photoelectric device 30 and the blue filter (B), and the second photo-sensing device 50b overlapping with the white filter (W) may sense mixed light of blue light and green light, that is, cyan light passing the photoelectric device 30 and the white filter (W).

Figure 8:
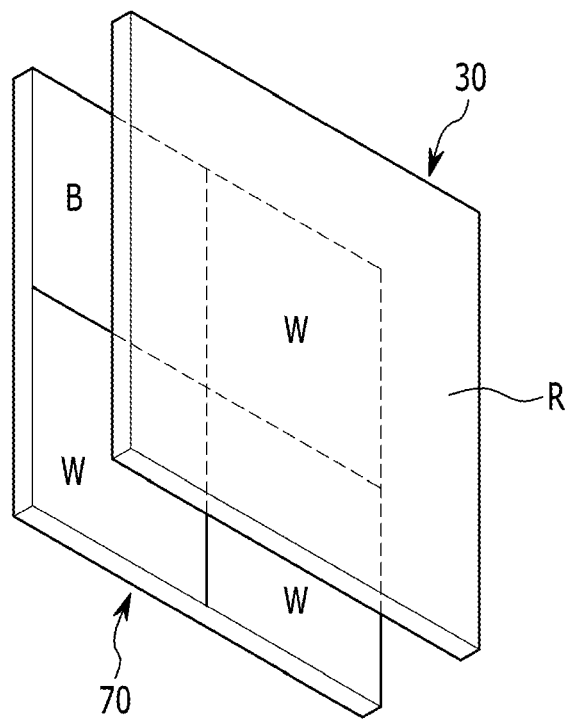

Referring to FIG. 8, the image sensor according to some example embodiments may include the red photoelectric device (R) formed in the whole surface and selectively absorbing and sensing red light and the color filter layer 70 including at least one blue filter (B) configured to selectively transmit blue light and at least one white filter (W) configured to selectively transmit mixed light of blue light, red light, and green light in a 2×2 matrix format. The quantity of white filters (W) is greater than the quantity of blue filters (B). Herein, the first photo-sensing device 50a overlapping with the blue filter (B) may sense blue light passing the photoelectric device 30 and the blue filter (B), and the second photo-sensing device 50b overlapping with the white filter (W) may sense mixed light of blue light and green light, that is, cyan light, passing the photoelectric device 30 and the white filter (W).

Figure 9:
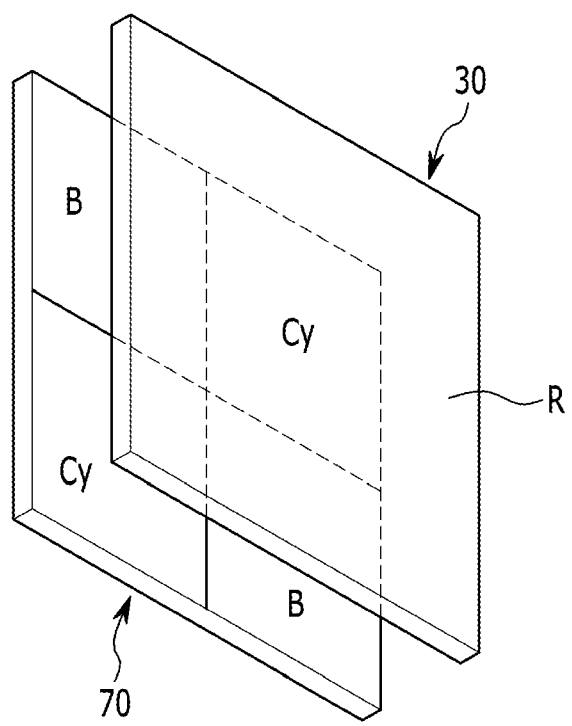

Referring to FIG. 9, the image sensor according to some example embodiments may include the red photoelectric device (R) formed in the whole surface and selectively absorbing and sensing red light and the color filter layer 70 including at least one blue filter (B) configured to selectively transmit blue light and at least one cyan filter (Cy) configured to selectively transmit mixed light of blue light and green light in a 2×2 matrix format. The quantity of blue filters (B) is the same as the quantity of cyan filters (Cy). Herein, the first photo-sensing device 50a overlapping with the blue filter (B) may sense blue light passing the photoelectric device 30 and the blue filter (B), and the second photo-sensing device 50b overlapping with the cyan filter (Cy) may sense mixed light of blue light and green light, that is, cyan light passing the photoelectric device 30 and the cyan filter (Cy).

Figure 10:
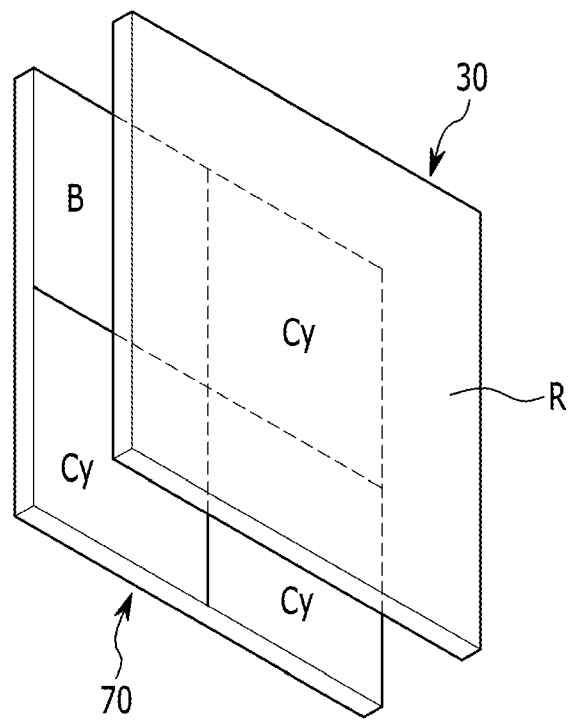

Referring to FIG. 10, the image sensor according to some example embodiments may include the red photoelectric device (R) selectively absorbing and sensing red light and the color filter layer 70 including at least one blue filter (B) configured to selectively transmit blue light and at least one cyan filter (Cy) configured to selectively transmit mixed light of blue light and green light in a 2×2 matrix format. The quantity of cyan filters (Cy) is greater than the quantity of blue filters (B). Herein, the first photo-sensing device 50a overlapping with the blue filter (B) may sense blue light passing the photoelectric device 30 and the blue filter (B), and the second photo-sensing device 50b overlapping with the cyan filter (Cy) may sense mixed light of blue light and green light, that is, cyan light passing the photoelectric device 30 and the cyan filter (Cy).

Figure 11:
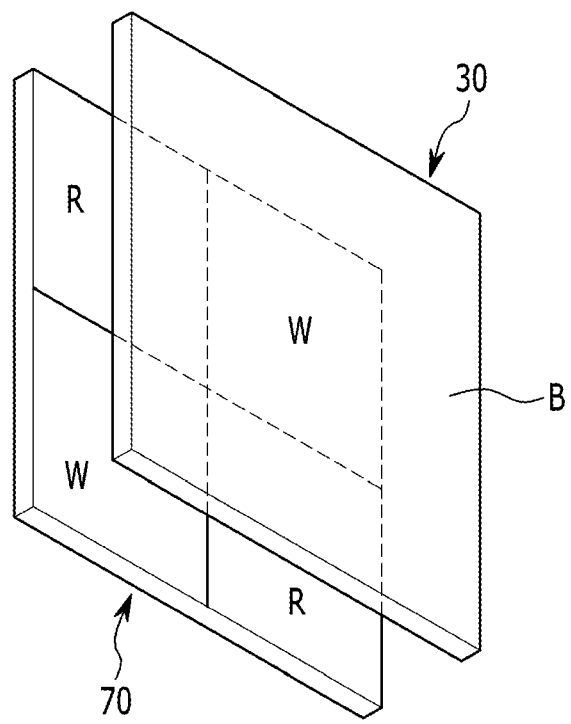

Referring to FIG. 11, the image sensor according to some example embodiments may include a blue photoelectric device (B) formed on the whole surface and selectively absorbing and sensing blue light and the color filter layer 70 including at least one red filter (R) configured to selectively transmit red light and at least one white filter (W) configured to selectively transmit mixed light of blue light, red light, and green light in a 2×2 matrix format. The quantity of red filters (R) is the same as the quantity of white filters (W). Herein, the first photo-sensing device 50a overlapping with the red filter (R) may sense red light passing the photoelectric device 30 and the red filter (R), and the second photo-sensing device 50b overlapping with the white filter (W) may sense mixed light of red light and green light, that is, cyan light passing the photoelectric device 30 and the white filter (W).

Figure 12:
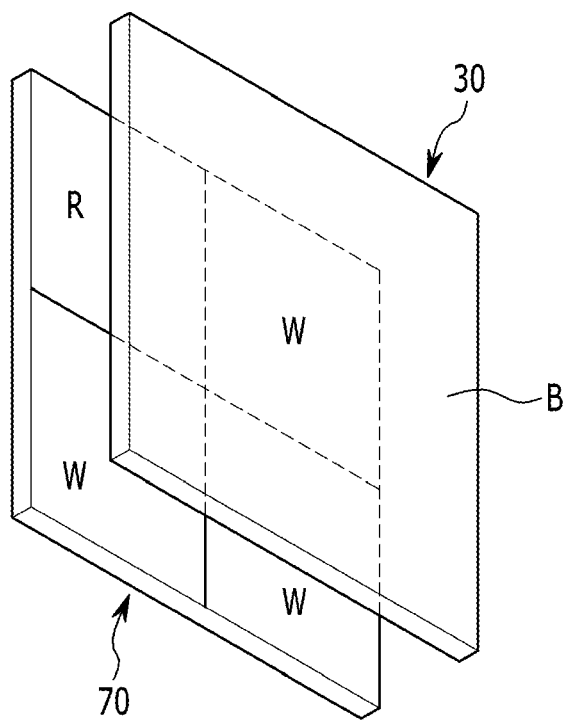

Referring to FIG. 12, the image sensor according to some example embodiments may include the blue photoelectric device (B) formed on the whole surface and selectively absorbing and sensing blue light and the color filter layer 70 including at least one red filter (R) configured to selectively transmit red light and at least one white filter (W) configured to selectively transmit mixed light of blue light, red light, and green light in a 2×2 matrix format. The quantity of white filters (W) is greater than the quantity of red filters (R). Herein, the first photo-sensing device 50a overlapping with the red filter (R) may sense red light passing the photoelectric device 30 and the red filter (R), and the second photo-sensing device 50b overlapping with the white filter (W) may sense mixed light of red light and green light, that is, yellow light passing the photoelectric device 30 and the white filter (W).

Figure 13:
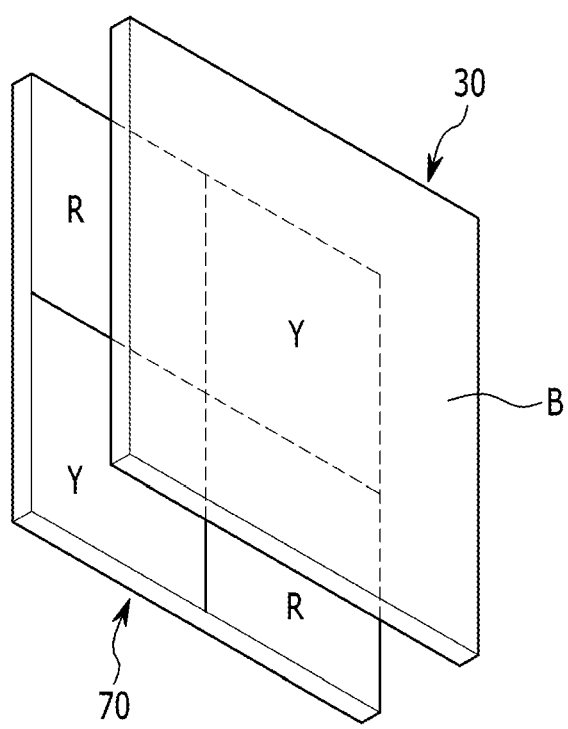

Referring to FIG. 13, the image sensor according to some example embodiments may include the blue photoelectric device (B) formed on the whole surface and selectively absorbing and sensing blue light and the color filter layer 70 including at least one red filter (R) configured to selectively transmit red light and at least one yellow filter (Y) configured to selectively transmit mixed light of red light and green light in a 2×2 matrix format. The quantity of red filters (R) is the same as the quantity of yellow filters (Y). Herein, the first photo-sensing device 50a overlapping with the red filter (R) may sense red light passing the photoelectric device 30 and the red filter (R), and the second photo-sensing device 50b overlapping with the yellow filter (Y) may sense mixed light of red light and green light, that is, yellow light passing the photoelectric device 30 and the yellow filter (Y).

Figure 14:
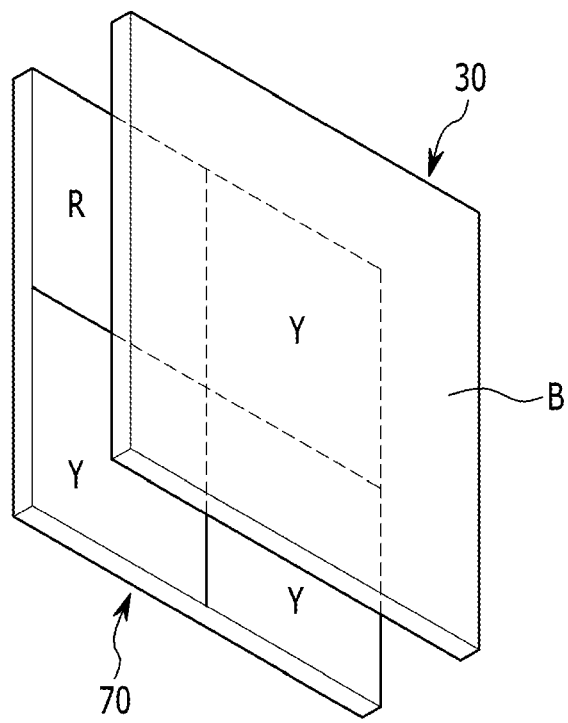

Referring to FIG. 14, the image sensor according to some example embodiments may include the blue photoelectric device (B) formed on the whole surface and selectively absorbing and sensing blue light and the color filter layer 70 including at least one red filter (R) configured to selectively transmit red light and at least one yellow filter (Y) configured to selectively transmit mixed light of red light and green light in a 2×2 matrix format. The quantity of yellow filters Y is greater than the quantity of red filters (R). Herein, the first photo-sensing device 50*a* overlapping with the red filter (R) may sense red light passing the photoelectric device 30 and the red filter (R), and the second photo-sensing device 50*b* overlapping with the yellow filter (Y) may sense mixed light of red light and green light, that is, yellow light passing the photoelectric device 30 and the yellow filter (Y).

Figure 15:
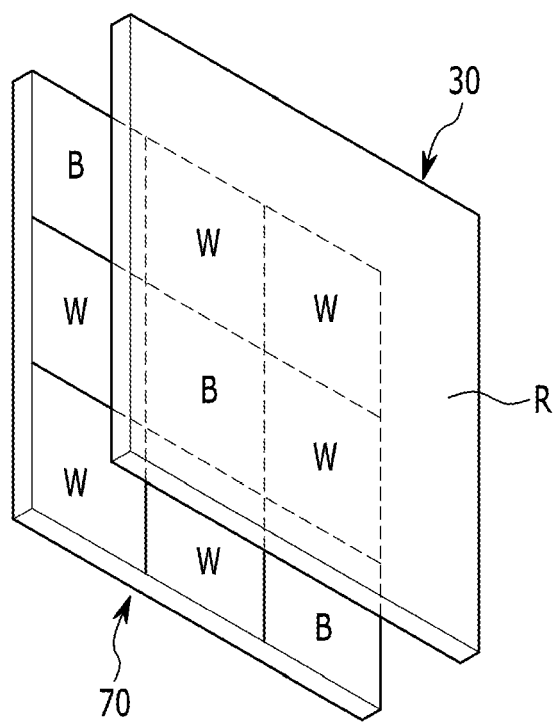
Figure 16:
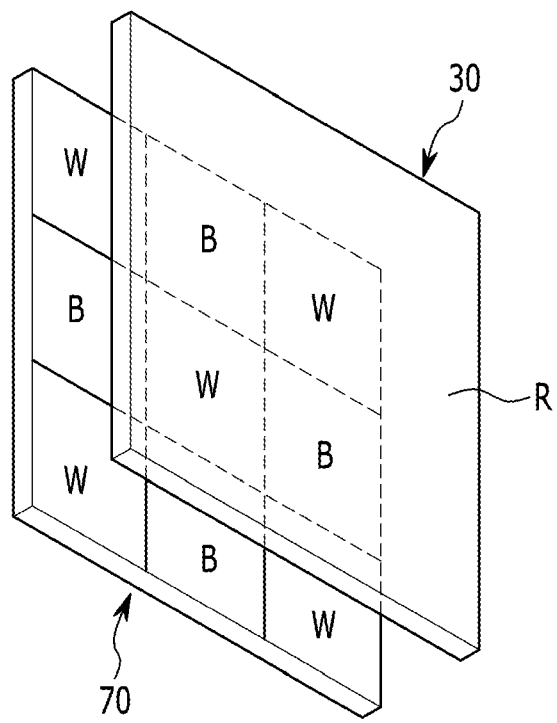

Referring to FIG. 15 and FIG. 16, the image sensor according to some example embodiments may include the red photoelectric device (R) formed on the whole surface and selectively absorbing and sensing red light and the color filter layer 70 including at least one blue filter (B) configured to selectively transmit blue light and at least one white filter configured to selectively transmit mixed light of blue light, red light, and green light in a 3×3 matrix format. The quantity of white filters (W) is greater than the quantity of blue filters (B). Herein, the first photo-sensing device 50*a* overlapping with the blue filter (B) may sense blue light passing the photoelectric device 30 and the blue filter (B), and the second photo-sensing device 50*b* overlapping with the white filter (W) may sense mixed light of blue light and green light, cyan light, passing the photoelectric device 30 and the white filter (W).

Figure 17:
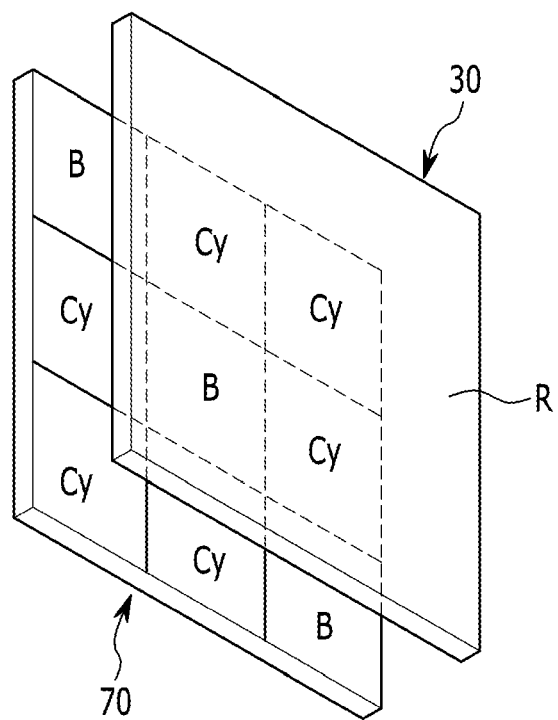
Figure 18:
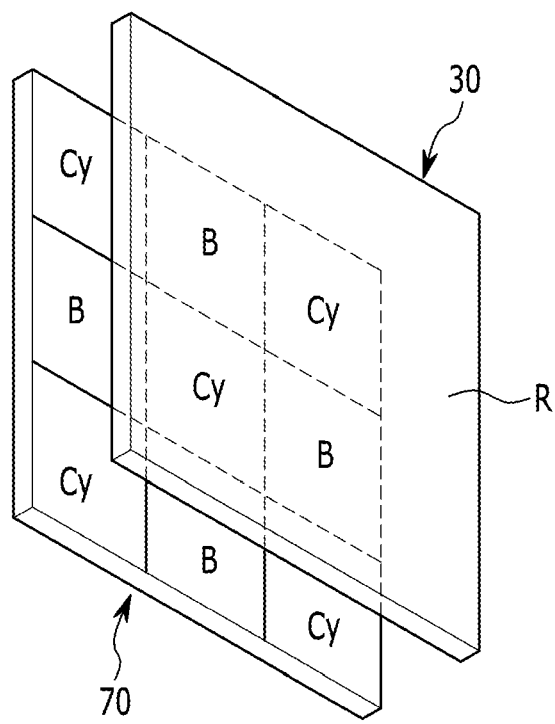

Referring to FIG. 17 and FIG. 18, the image sensor according to some example embodiments may include the red photoelectric device (R) formed on the whole surface and selectively absorbing and sensing red light and the color filter layer 70 including at least one blue filter (B) configured to selectively transmit blue light and at least one cyan filter (Cy) configured to selectively transmit mixed light of blue light and green light in a 3×3 matrix format. The quantity of cyan filters (Cy) is greater than the quantity of blue filters (B). Herein, the first photo-sensing device 50*a* overlapping with the blue filter (B) may sense blue light passing the photoelectric device 30 and the blue filter (B), and the second photo-sensing device 50*b* overlapping with the cyan filter (Cy) may sense mixed light of blue light and green light, cyan light passing the photoelectric device 30 and the cyan filter (Cy).

Figure 19:
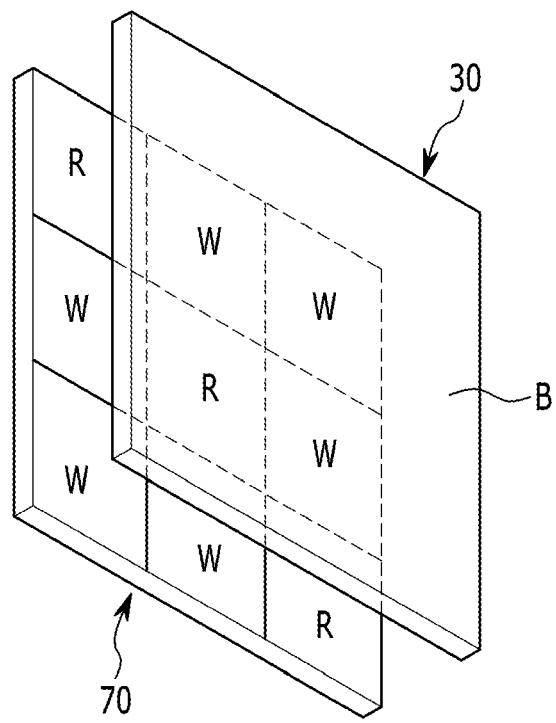
Figure 20:
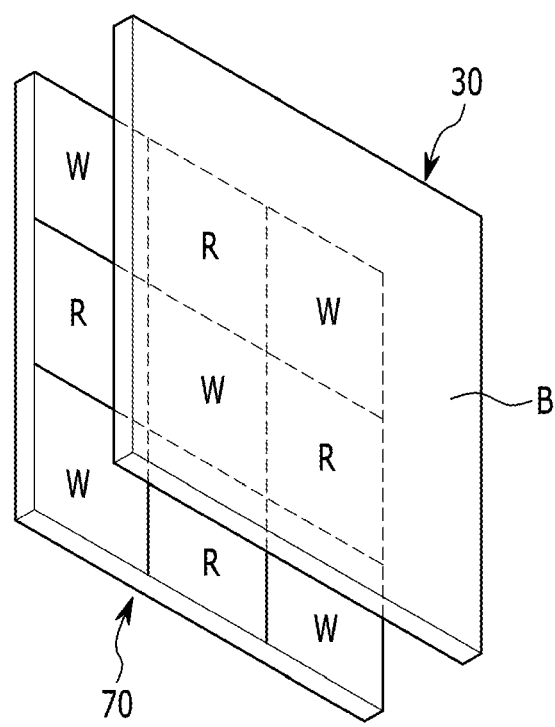

Referring to FIG. 19 and FIG. 20, the image sensor according to some example embodiments may include the blue photoelectric device (B) formed on the whole surface and selectively absorbing and sensing blue light and the color filter layer 70 including at least one red filter (R) configured to selectively transmit red light and at least one white filter (W) configured to selectively transmit mixed light of red light, green light, and blue light in a 3×3 matrix format. The quantity of white filters (W) is greater than the quantity of red filters (R). Herein, the first photo-sensing device 50*a* overlapping with the red filter (R) may sense red light passing the photoelectric device 30 and the red filter (R), and the second photo-sensing device 50*b* overlapping with the white filter (W) may sense mixed light of red light and green light, that is, yellow light passing the photoelectric device 30 and the white filter (W).

Figure 21:
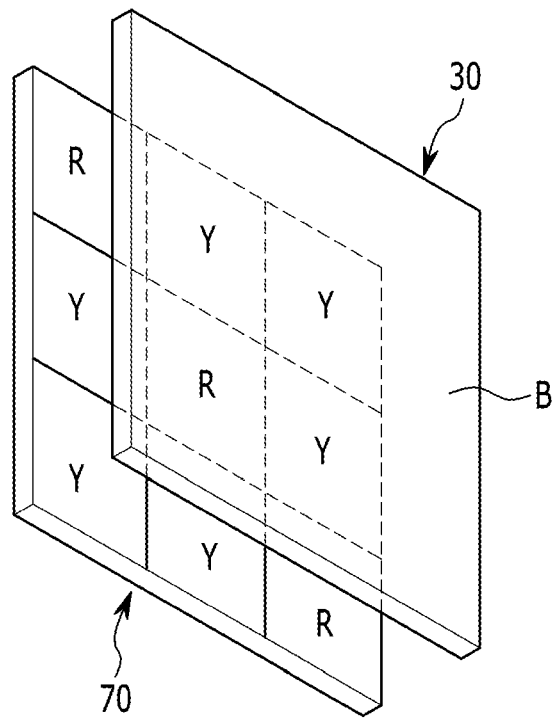
Figure 22:
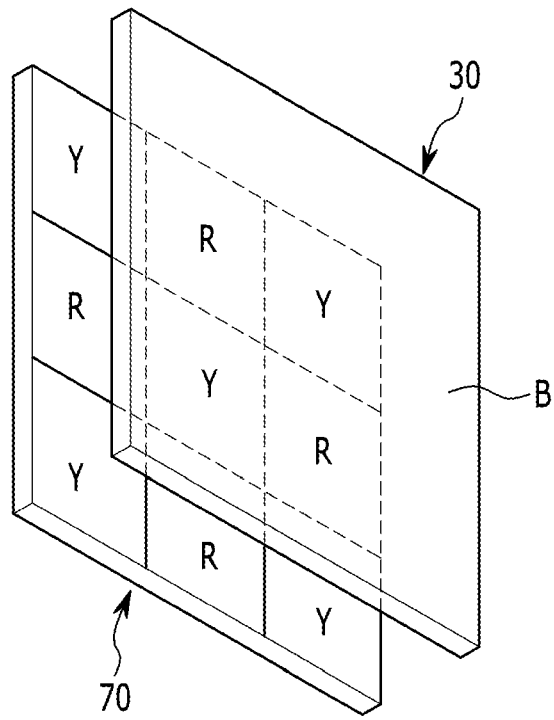

Referring to FIG. 21 and FIG. 22, the image sensor according to some example embodiments may include the blue photoelectric device (B) formed on the whole surface and selectively absorbing and sensing blue light and the color filter layer 70 including at least one red filter (R) configured to selectively transmit red light and at least one yellow filter (Y) configured to selectively transmit mixed light of red light and green light in a 3×3 matrix format. The quantity of yellow filters (Y) is greater than the quantity of red filters (R). Herein, the first photo-sensing device 50*a* overlapping with the red filter (R) may sense red light passing the photoelectric device 30 and the red filter (R), and the second photo-sensing device 50*b* overlapping with the yellow filter (Y) may sense mixed light of red light and green light, that is, yellow light passing the photoelectric device 30 and the yellow filter (Y).

The image sensor according to some example embodiments has a structure that the photo-sensing device and the photoelectric device are stacked and thus may have a reduced area and be down-sized.

In addition, the image sensor according to some example embodiments includes a color filter configured to selectively transmit mixed light and thus may decrease a light loss due to the color filter and increase light absorption efficiency. Accordingly, a highly sensitive image sensor may be realized.

The image sensor according to some example embodiments shown in FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, and FIG. 22 may be compared with a conventional non-stacked image sensor of 2×2 and 3×3 matrix formats to evaluate improvement of light absorption efficiency.

Figure 23:
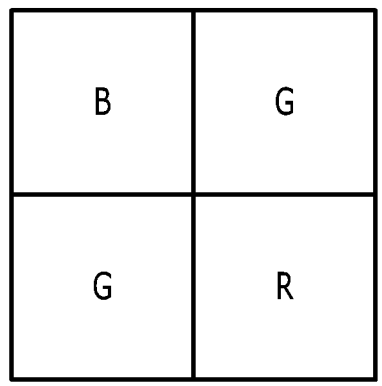
Figure 24:
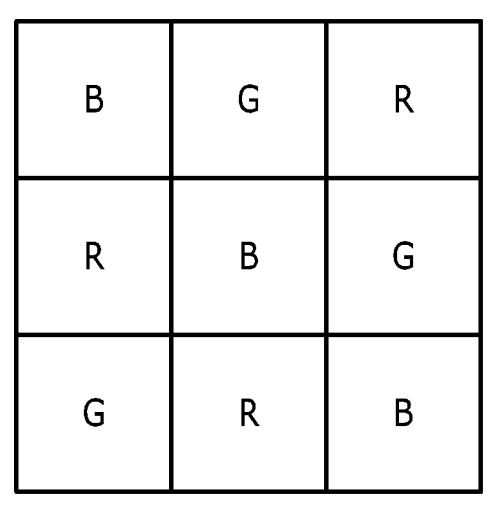

FIG. 23 and FIG. 24 show examples of disposing a color filter layer in the conventional non-stacked image sensor of 2×2 and 3×3 matrix formats.

The light absorption efficiency is evaluated through relative comparison as follows.

1) Incident light entering a unit pixel is regarded to be 1.

2) Since a color filter such as a red filter, a green filter, and a blue filter passes ⅓ of the incident light, light sensed in a photo-sensing device of the unit pixel is regarded to be ⅓.

3) Since the photoelectric device selectively absorbs red, green, or blue light, light absorbed in the photoelectric device is regarded to be ⅓.

4) Since a mixed filter absorbs two or three colors except for light absorbed in the photoelectric device, light sensed in a photo-sensing device of the unit pixel is regarded to be ⅔. In other words, when the photoelectric device absorbing a first visible light is overlapping with a white filter, light sensed in the photo-sensing device of the unit pixel is light except for the first visible light out of the incident light and thus regarded to be ⅔. Likewise, when the photoelectric device absorbing a first visible light is overlapping with a mixing filter configured to selectively transmit and mixing mixed light except for the first visible light, that is, a cyan filter or a yellow filter, light sensed in the photo-sensing device of the unit pixel is regarded to be ⅔ out of the incident light.

5) A relative ratio is calculated based on 100% of light absorption efficiency of Reference examples 1 and 2.

The results are provided in Table 1.

TABLE 1

| | Structure | Light absorbance maximum 1 | Relative ratio (%) |
|---|---|---|---|
| Reference example 1 2 × 2 | FIG. 23 | 1/3 | 100 |
| Reference example 2 3 × 3 | FIG. 24 | 1/3 | 100 |
| Example 2 × 2 | FIG. 7, 11 | 10/12 | 250 |
| | FIG. 8, 12 | 11/12 | 275 |
| | FIG. 9, 13 | 10/12 | 250 |
| | FIG. 10, 14 | 11/12 | 275 |
| Example 3 × 3 | FIG. 15, 19 | 8/9 | 267 |
| | FIG. 16, 20 | 23/27 | 256 |
| | FIG. 17, 21 | 8/9 | 267 |
| | FIG. 18, 22 | 23/27 | 256 |

Referring to Table 1, the image sensor according to some example embodiments shown in FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, and FIG. 22 is expected to show greater than or equal to twice higher light absorption efficiency than the conventional non-stacked image sensors according to Reference examples 1 and 2. Accordingly, a highly-sensitive image sensor may be realized.

Figure 25:
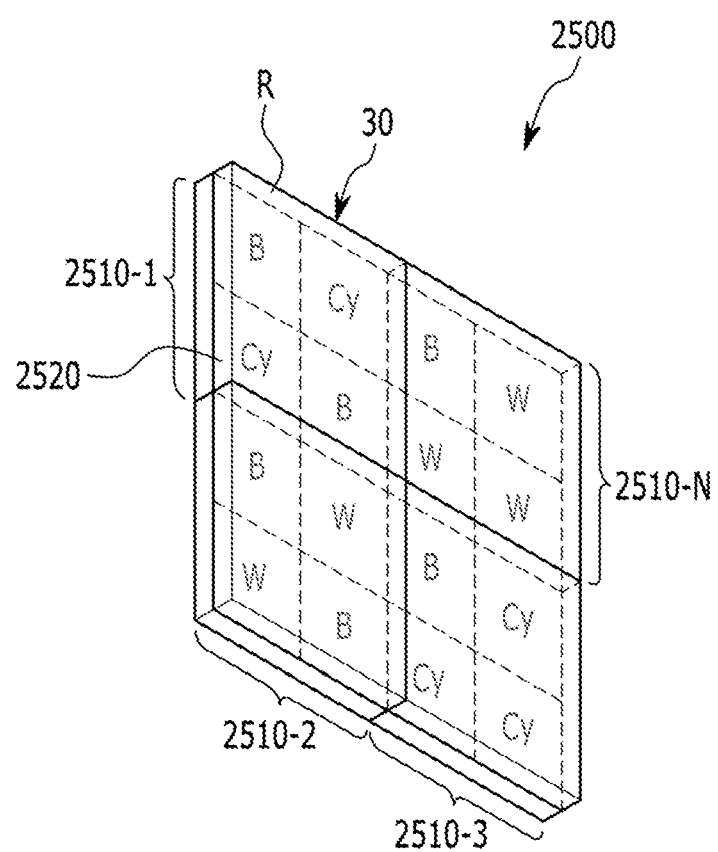
FIG. 25 shows an image sensor that includes multiple arrays of color filters according to some example embodiments.

FIG. 25 shows an image sensor that includes multiple arrays of color filters according to some example embodiments.

In some example embodiments, an image sensor may include multiple arrays of color filters included in the example embodiments, where at least two of the arrays include different arrays of color filters. In the example embodiment illustrated in FIG. 25, for example, an image sensor 2500 includes an array of color filter arrays 2510-1 to 2510-N. Each array of color filters 2510-1, 2510-2, 2510-3, 2510-N includes a separate, respective array of color filters 2520. In some example embodiments, the image sensor 2500 includes a common photoelectric device 30 that extends over each of the color filter arrays 2510-1 to 2510-N.

As shown in FIG. 25, each of the color filter arrays 2510-1 to 2510-N may include a different configuration of color filters. As shown, for example, where image sensor 2500 includes a single photoelectric device 30 that is configured to selectively sense red color light and extends over each of the color filter arrays 2510-1 to 2510-N, color filter array 2510-1 includes a 2×2 array of two blue color filters 2520 and two cyan color filters 2520, color filter array 2510-2 includes a 2×2 array of two blue color filters 2520 and two white color filters 2520, color filter array 2510-3 includes a 2×2 array of one blue color filter 2520 and three cyan color filters 2520, and color filter array 2510-N includes a 2×2 array of one blue color filter 2520 and three white color filters 2520.

It will be understood that some example embodiments of the image sensor 2500 may include larger color filter arrays ("arrays of color filters") 2510-1 to 2510-N, including at least a 3×3 array. Some example embodiments of the image sensor 2500 may include multiple photoelectric devices 30 that are each one separate sets of color filter arrays 2510-1 to 2510-N.

It will be understood that the color filters in the color filter arrays 2510-1 to 2510-N and 2520-1 to 2520-N are on separate photo-sensing devices, including one or more of the photo-sensing devices 50a and 50b shown in FIG. 1 and FIG. 2. The image sensor 2500 may generate images based on information generated by the photoelectric device 30 and the photo-sensing devices on which the color filters of the color filter arrays 2510-1 to 2510-N and 2520-1 to 2520-N are located. Each of the color filter arrays 2510-1 to 2510-N and 2520-1 to 2520-N may be on a separate corresponding array of photo-sensing devices.

An image sensor 2500 that includes different color filter arrays on separate arrays of photo-sensing devices and different photoelectric devices may have improved average light absorption efficiency and sensitivity due to being configured to generate images via information generated by different photo-sensing devices and photoelectric devices exposed to a common illumination environment. Some photoelectric devices and photo-sensing devices may be configured to provide improved light absorption efficiency and sensitivity than other image sensors under various illumination environments. The image sensor 2500 may be configured to mitigate light absorption efficiency and sensitivity deficiencies that may be present in any one particular photoelectric device and photo-sensing device from contributing to an overall deterioration in average light absorption efficiency and sensitivity of the image sensor 2500. In addition, when at least one array of photo-sensing devices overlapping a corresponding color filter array 2510-1 is configured to provide enhanced light absorption efficiency and sensitivity under particular illumination environments where at least one other array of photo-sensing devices overlapping another corresponding color filter array 2520-1 provides degraded light absorption efficiency and sensitivity under the same particular illumination environments, the at least one array of photo-sensing devices overlapping the corresponding color filter array 2510-1 may negate any overall degradation in average light absorption efficiency and sensitivity of the image sensor 2500 under the particular illumination environments.

Figure 26:
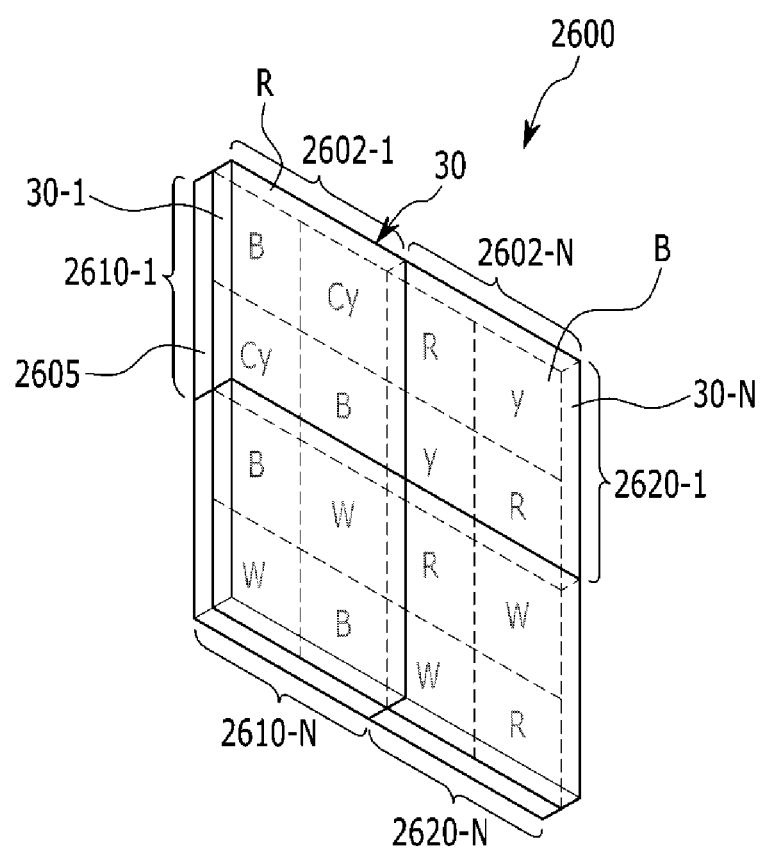
FIG. 26 shows an image sensor that includes multiple arrays of color filters and multiple photoelectric devices according to some example embodiments.

FIG. 26 shows an image sensor that includes multiple arrays of color filters and multiple photoelectric devices according to some example embodiments.

In some example embodiments, an image sensor may include multiple, different photoelectric devices on separate sets of color filter arrays. In the example embodiment illustrated in FIG. 26, for example, an image sensor 2600 includes separate photoelectric devices 30-1 to 30-N on separate sets 2602-1 to 2602-N of color filter arrays 2610-1 to 2610-N and 2620-1 to 2620-N.

For example, the image sensor 2600 illustrated in FIG. 26 includes a photoelectric device 30-1 that is configured to selectively sense red color light, and the photoelectric device 30-1 is on a set 2602-1 of color filter arrays 2610-1 to 2610-N, such that each of the color filter arrays 2610-1 to 2610-N may receive light from a photoelectric device 30-1 that includes a red color filter.

In addition, the image sensor 2600 illustrated in FIG. 26 includes a photoelectric device 30-N that is configured to selectively sense blue color light, and the photoelectric device 30-N is on a set 2602-2 of color filter arrays 2620-1 to 2620-N, such that each of the color filter arrays 2620-1 to 2620-N may receive light from a photoelectric device 30-N that includes a blue color filter.

As shown in FIG. 26, each of the color filter arrays 2610-1 to 2610-N and 2620-1 to 2620-N may include different sets of color filters 2605. The color filters 2605 that may be included in a given color filter array may be based on the color selectively sensed by the respective photoelectric device 30-1 to 30-N that is on the respective color filter array.

As shown in FIG. 26, for example, where image sensor 2600 includes a photoelectric device 30-1 that includes a red color filter and extends over each of the color filter arrays 2610-1 to 2610-N, color filter array 2610-1 includes a 2×2 array of two blue color filters 2605 and two cyan color filters 2605 and color filter array 2610-N includes a 2×2 array of two blue color filters 2605 and two white color filters 2605.

In addition, where image sensor 2600 includes a photoelectric device 30-N that includes a blue color filter and extends over each of the color filter arrays 2620-1 to 2620-N, color filter array 2620-1 includes a 2×2 array of two red color filters 2605 and two yellow color filters 2605 and color filter array 2620-N includes a 2×2 array of two red color filters 2605 and two white color filters 2605.

It will be understood that, where a photoelectric device selectively senses a first wavelength spectrum of light, the photoelectric device may be on a color filter array that includes a quantity of color filters configured to selectively transmit at least one of a second wavelength spectrum of light, a third wavelength spectrum of light, and a fourth wavelength spectrum of light. For example, photoelectric devices 30-1 and 30-N shown in FIG. 26 may be configured to selectively sense first and second wavelengths of light, respectively. The color filter array 2610-1 may include at least one color filter configured to selectively transmit the second wavelength spectrum of light and a third wavelength spectrum of light. The third wavelength spectrum of light may include the second wavelength spectrum of light. In addition, the color filter array 2620-1 may include at least one color filter configured to selectively transmit the first wavelength spectrum of light and at least one color filter configured to selectively transmit a fourth wavelength spectrum of light. The fourth wavelength spectrum of light may include the first wavelength spectrum of light.

It will be understood that some example embodiments of the image sensor 2600 may include larger arrays color filters, including at least a 3×3 array.

It will be understood that the color filters in the color filter arrays 2610-1 to 2610-N and 2620-1 to 2620-N are on separate photo-sensing devices, including one or more of the photo-sensing devices 50a and 50b shown in FIG. 1 and FIG. 2. The image sensor 2600 may generate images based on information generated by the photoelectric devices 30-1 to 30-N and the photo-sensing devices on which the color filters of the color filter arrays 2610-1 to 2610-N and 2620-1 to 2620-N are located. Each of the color filter arrays 2610-1 to 2610-N and 2620-1 to 2620-N may be on a separate corresponding array of photo-sensing devices.

An image sensor 2600 that includes different color filter arrays on separate arrays of photo-sensing devices and different photoelectric devices may have improved average light absorption efficiency and sensitivity due to being configured to generate images via information generated by different photo-sensing devices and photoelectric devices exposed to a common illumination environment. Some photoelectric devices and photo-sensing devices may be configured to provide improved light absorption efficiency and sensitivity than other image sensors under various illumination environments. The image sensor 2600 may be configured to mitigate light absorption efficiency and sensitivity deficiencies that may be present in any one particular photoelectric device and photo-sensing device from contributing to an overall deterioration in average light absorption efficiency and sensitivity of the image sensor 2600. In addition, when at least one array of photo-sensing devices overlapping a corresponding color filter array 2610-1 is configured to provide enhanced light absorption efficiency and sensitivity under particular illumination environments where at least one other array of photo-sensing devices overlapping another corresponding color filter array 2620-1 provides degraded light absorption efficiency and sensitivity under the same particular illumination environments, the at least one array of photo-sensing devices overlapping the corresponding color filter array 2610-1 may negate any overall degradation in average light absorption efficiency and sensitivity of the image sensor 2600 under the particular illumination environments.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. An image sensor comprising
a semiconductor substrate including a plurality of photo-sensing devices,
a photoelectric device on the semiconductor substrate and configured to selectively sense a first visible light, the first visible light including light in a first wavelength spectrum; and
a plurality of color filters on the plurality of photo-sensing devices, each of the color filters being on a separate photo-sensing device of the plurality of photo-sensing devices, the plurality of color filters including
a first color filter configured to selectively transmit second visible light, the second visible light including light in a second wavelength spectrum, the second wavelength spectrum being different from the first wavelength spectrum, and
a second color filter configured to transmit a first mixed light, the first mixed light including light in the second wavelength spectrum and light in a third wavelength spectrum, the third wavelength spectrum being different from the second wavelength spectrum;
wherein the plurality of photo-sensing devices includes
a first photo-sensing device overlapping with the first color filter and configured to sense the second visible light, and
a second photo-sensing device overlapping with the second color filter and configured to sense a second mixed light, the second mixed light including the second visible light.

2. The image sensor of claim 1, wherein
the plurality of color filters includes a color filter array, the color filter array including a quantity of first color filters and a quantity of second color filters,
the quantity of first color filters includes at least one first color filter,
the quantity of second color filters includes at least one second color filter, and
the quantity of second color filters is equal to or greater than the quantity of first color filters.

3. The image sensor of claim 1, wherein
the second mixed light and the first mixed light have a common wavelength spectrum, and
each of the first mixed light and the second mixed light excludes the first visible light.

4. The image sensor of claim 3, wherein
each of the first mixed light and the second mixed light includes at least one of
a mixture of blue light and green light, and
a mixture of red light and green light.

5. The image sensor of claim 1, wherein
the first mixed light includes the first visible light, and
the second mixed light excludes the first visible light.

6. The image sensor of claim 5, wherein each of the first mixed light and the second mixed light includes green light.

7. The image sensor of claim 5, wherein
the first mixed light includes a mixture of red light, green light, and blue light, and
the second mixed light includes at least one of
a mixture of blue light and green light, and
a mixture of red light and green light.

8. The image sensor of claim 1, wherein
the second visible light includes blue light, and
the second mixed light includes a mixture of blue light and green light.

9. The image sensor of claim 1, wherein
the second visible light includes red light, and
the second mixed light includes a mixture of red light and green light.

10. The image sensor of claim 1, wherein
the first photo-sensing device has a first thickness,
the second photo-sensing device has a second thickness, and
the first thickness is different from the second thickness.

11. The image sensor of claim 10, wherein the second thickness is greater than the first thickness.

12. The image sensor of claim 1, wherein the first visible light includes at least one of red light and blue light.

13. The image sensor of claim 12, wherein the first visible light includes red light and the second visible light includes blue light.

14. The image sensor of claim 12, wherein the first visible light includes blue light and the second visible light includes red light.

15. The image sensor of claim 1, wherein the first mixed light includes a mixed light, the mixed light including at least the first visible light.

16. The image sensor of claim 1, wherein the first mixed light includes a mixed light, the mixed light including red light, green light, and blue light.

17. The image sensor of claim 1, wherein the first mixed light includes a mixed light, the mixed light excluding the first visible light.

18. The image sensor of claim 1, wherein the photoelectric device includes
a pair of electrodes, the electrodes facing each other, and
a light absorption layer between the pair of electrodes, the light absorption layer being configured to selectively absorb the first visible light.

19. An electronic device comprising the image sensor of claim 1.

20. An image sensor, comprising:
at least first and second arrays of photo-sensing devices;
at least first and second arrays of color filters on separate, respective ones of the first and second arrays of photo-sensing devices, the second array of color filters including a different configuration of color filters from the first array of color filters, each array of color filters including at least two color filters configured to selectively transmit at least two separate wavelength spectra of light; and
at least one photoelectric device on the first and second arrays of color filters, the at least one photoelectric device being configured to selectively sense a wavelength spectrum of light that is different from the at least two separate light wavelength spectra of light.

21. The image sensor of claim 20, wherein
the at least one photoelectric device includes first and second photoelectric devices on separate, respective ones of the first and second arrays of color filters, the first and second photoelectric devices being configured to selectively sense different wavelength spectra of light.

22. The image sensor of claim 21, wherein
the first array of color filters includes a quantity of first color filters and a quantity of second color filters;
the second plurality of filters includes a second color filter array; and
the second color filter array includes at least a quantity of third color filters.

23. The image sensor of claim 22, wherein the second color filter array includes a quantity of second color filters.

24. The image sensor of claim 22, wherein the second color filter array includes a quantity of fourth color filters.

* * * * *